(12) United States Patent
Bitter et al.

(10) Patent No.: US 9,329,487 B2
(45) Date of Patent: May 3, 2016

(54) OBJECTIVE FOR EUV MICROSCOPY, EUV LITHOGRAPHY, AND X-RAY IMAGING

(71) Applicants: Manfred Bitter, Princeton, NJ (US);
Kenneth W. Hill, Plainsboro, NJ (US);
Philip Efthimion, Bedminster, NJ (US)

(72) Inventors: Manfred Bitter, Princeton, NJ (US);
Kenneth W. Hill, Plainsboro, NJ (US);
Philip Efthimion, Bedminster, NJ (US)

(*) Notice: Subject to any disclaimer, the term of this patent is extended or adjusted under 35 U.S.C. 154(b) by 91 days.

(21) Appl. No.: 14/465,404

(22) Filed: Aug. 21, 2014

(65) Prior Publication Data
US 2015/0055755 A1    Feb. 26, 2015

Related U.S. Application Data

(60) Provisional application No. 61/868,252, filed on Aug. 21, 2013.

(51) Int. Cl.
| | | |
|---|---|---|
| *G03F 7/20* | (2006.01) | |
| *G02B 21/04* | (2006.01) | |
| *G03F 1/84* | (2012.01) | |

(52) U.S. Cl.
CPC ............ *G03F 7/70033* (2013.01); *G02B 21/04* (2013.01); *G03F 1/84* (2013.01); *G03F 7/70233* (2013.01)

(58) Field of Classification Search
CPC ............ G03F 7/70233; G03F 7/70033; G02B 17/0657; G02B 17/0652; G02B 17/0856; G02B 17/0892; G02B 19/0028; G02B 19/0033; G02B 19/0095; G02B 21/04; H01J 37/10
See application file for complete search history.

(56) References Cited

U.S. PATENT DOCUMENTS

| | | | | |
|---|---|---|---|---|
| 6,038,285 A | * | 3/2000 | Zhong | ...................... G21K 1/06 378/79 |
| 8,217,353 B1 | * | 7/2012 | Bitter | ......................... G01J 3/20 250/336.1 |
| 2014/0085615 A1 | * | 3/2014 | Pretorius | .............. H04N 9/3126 353/99 |

OTHER PUBLICATIONS

A. Artyukov and K. M. Krymski, "Schwarzschild objective for soft x-ray," Opt. Eng. 39: 2163-2170 (2000).
M. D. Shumway, Sang Hun Lee, C. H. Choa, et al., Extremely fine-pitch printing with a 10× Schwarzschild optic at extreme ultraviolet wavelengths, in Proc. SPIE, 4343:357-362 (2001).

(Continued)

*Primary Examiner* — Hoon Song
(74) *Attorney, Agent, or Firm* — Meagher Emanuel Laks Goldberg & Liao, LLP

(57) ABSTRACT

Disclosed is an imaging apparatus for EUV spectroscopy, EUV microscopy, EUV lithography, and x-ray imaging. This new imaging apparatus could, in particular, make significant contributions to EUV lithography at wavelengths in the range from 10 to 15 nm, which is presently being developed for the manufacturing of the next-generation integrated circuits. The disclosure provides a novel adjustable imaging apparatus that allows for the production of stigmatic images in x-ray imaging, EUV imaging, and EUVL. The imaging apparatus of the present invention incorporates additional properties compared to previously described objectives. The use of a pair of spherical reflectors containing a concave and convex arrangement has been applied to a EUV imaging system to allow for the image and optics to all be placed on the same side of a vacuum chamber. Additionally, the two spherical reflector segments previously described have been replaced by two full spheres or, more precisely, two spherical annuli, so that the total photon throughput is largely increased. Finally, the range of permissible Bragg angles and possible magnifications of the objective has been largely increased.

26 Claims, 3 Drawing Sheets

(56) References Cited

OTHER PUBLICATIONS

S. Singh, H. Solak, and F. Cerrina, "Multilayer roughness and image formation in the Schwarzschild objective," Rev. Sci. Instrum. 67: 1-8 (1996).

A. Budano, F. Flora, L. Mezi, Analytical design method for a modified Schwarzschild optics Appl. Opt. 45: 4254 (2006).

A. A. Malyutin, Analysis of the applications of the Schwarzschild objective in the soft x-ray and VUV spectral ranges. 2. Diffraction modelling of aberrations, Quantum Electronics 27 (2): 182-184 (1997).

D. B. Sinars, M. E. Cuneo, G. R. Bennett, et al., Monochromatic x-ray backlighting of wire-array z-pinch plasmas using spherically bent quartz crystals, Rev. Sci. Instrum. 74(3): 2202-2205(2003).

E.J. Gamboa, D.S. Montgomery, I.M. Hall, et al., Imaging X-ray crystal spectrometer for laser-produced plasmas, J. Inst., 6: 1-6 (2011).

K. Fujita, H. Nishimura, I. Niki., Monochromatic x-ray imaging with bent crystals for laser fusion research, Rev. Sci. Instrum. 72(1): 744-747(2001).

D. L. Shealy, R. B. Hoover, T. W. Barbee, et al., "Design and analysis of a Schwarzschild imaging multilayer x-ray microscope," Opt. Eng. 29: 721-727 (1990).

D. L. Shealy, C. Wang, J. Wu, and R. B. Hoover, "Design and analysis of soft x-ray imaging microscopes," in Proc. SPIE, 1546: 117-124 (1991).

D. L. Shealy, C. Wang, and R. B. Hoover, "Optical analysis of an ultra-high resolution two-mirror soft x-ray microscopy," J. X-Ray Sci. Technol. 5: 1-19 (1995).

R. B. Hoover, D. L. Shealy, D. R. Gabardi, et al., "Design of an Imaging Microscope for Soft X-Ray Applications", in Proc. SPIE, 984: 234-246(1988).

A. Artyukov, "Schwarzchild objective and similar two-mirror system", in Proc. SPIE, 8687: 86870A (2012).

S. Bollanti, P. Dilazzaro, F. Flora, et al., "Conventional and modified Schwarzschild objective for EUV lithography: design relation", Appl. Phys. B 85: 603-610 (2006).

M. Bitter, K. W. Hill, L. F. Delgado-Aparicio, et al., "A new scheme for stigmatic x-ray imaging with large magnification", Rev. Sci. Instrum., 83: (2012).

* cited by examiner

OBJECTIVE FOR EUV MICROSCOPY, EUV LITHOGRAPHY, AND X-RAY IMAGING

CROSS-REFERENCE TO PRIOR FILED APPLICATIONS

This application claims the benefit of U.S. Provisional Application No. 61/868,252 filed Aug. 21, 2013, which is incorporated herein in its entirety.

STATEMENT REGARDING FEDERALLY SPONSORED RESEARCH OR DEVELOPMENT

This invention was made with government support under Grant No. DE-AC02-09CH11466 awarded by the Department of Energy. The government has certain rights in this invention.

TECHNICAL FIELD

This present disclosure generally relates to an imaging apparatus for use with extreme ultraviolet light and x-rays.

BACKGROUND OF THE INVENTION

Extreme ultraviolet (EUV) rays can be used for EUV lithography (EUVL), EUV spectroscopy, and EUV microscopy. Of particular interest is the EUV lithography at wavelengths near 13.5 nm for the manufacture of the next-generation integrated circuits, where objectives can be used to transfer or print de-magnified images of circuit components from a mask onto semi-conductor surfaces with a spatial resolution of better than 45 nm. The optimization of EUV lithography for the manufacture of the next-generation integrated circuits is a subject of intense research in industry and laboratories worldwide (Bollanti, Dilazzaro, et al., 2006; Budano, Flora, et al., 2006; Wu and Kumar, 2007).

EUV lithography poses many challenges. EUV is absorbed by all matter, thus requiring EUV lithography to take place under vacuum. Furthermore, EUV radiation requires multi-layer reflectors in order to focus the rays for lithography. Due to these multilayer reflectors, the Bragg condition needs to be satisfied for a given reflector. Moreover, the components of a EUV system that are directly exposed to the EUV light source, which is usually a plasma produced by directing a powerful laser beam onto a solid or liquid target, are vulnerable to damage from the simultaneously emitted high-energy ions and other debris.

Schwarzschild objectives and their modifications are the leading candidates to transfer or print de-magnified images of circuit components from a mask onto semi-conductor surfaces. The conventional Schwarzschild objectives consist of two concentric, concave and convex, spherical mirrors or reflectors and were originally developed for use in astronomy, where the rays are all paraxial. Schwarzschild objectives are therefore not optimized for the non-paraxial rays encountered in lithography, since image distortions, such as spherical aberrations, coma, and astigmatism occur if the rays deviate from near-normal incidence.

For EUV lithography at wavelengths near 13.5 nm, which will be used for the manufacture of the next-generation integrated circuits, the reflectors must be spherical multi-layer structures with a certain distance, d, between the consecutive Bragg reflecting layers of those structures. Therefore, the Bragg condition must be simultaneously satisfied on the reflectors, which comprise the EUV objective. This latter condition is a challenging requirement for all the Schwarzschild designs, which have been considered for lithography at 13.5 nm so far, since with those designs this condition can be satisfied only locally and cannot be met over the entire area of the reflectors. Therefore, an image of the entire object (mask) can only be obtained in multiple exposures by moving both mask and wafer synchronously (scanning) through an EUV beam of a small cross-section.

Attempts have been made to increase the Bragg-reflecting area of the reflectors by laterally grading the d-spacing of the multi-layer structures over the area of the two reflectors (Foltyn, Bergmann, et al., 2004). Aside from the technical challenges in the manufacturing of such multilayer structures, a lateral grading of the d-spacing will also cause additional imaging errors, since the spherical symmetry of the two concentric reflectors is thereby destroyed.

Another problem with the presently used Schwarzschild systems is that even small deviations from normal incidence lead to severe image distortions due to astigmatism and spherical aberration (Bollanti, Dilazzaro, et al., 2006; Budano, Flora, et al., 2006). Attempts to deal with these faults have resulted in an increase in the number of optical elements in the optical chain, which reduce the throughput, and require longer exposure times or more powerful and expensive EUV sources. In this case the lifetime of the EUV source and damage of the collector mirror near the source become significant problems, and can cause costly downtime for cleaning or replacing parts.

U.S. Pat. No. 8,217,353 describes an imaging arrangement applicable to EUV and x-ray imaging where the Bragg condition is satisfied on a pair of matched spherical concave reflectors. This design is, however, impractical for EUV lithography because the optics and object to be imaged would be on opposite sides of the vacuum chamber required for EUVL and EUV imaging. Furthermore, since the image would be projected on a point on yet another end of the chamber, the size of the imaging arrangement would be prohibitively large.

A two-dimensional, stigmatic x-ray imaging system, which consists of two concentric, convex and concave, spherically bent crystals has been proposed (Bitter, Hill, et al., 2012). This x-ray imaging system, which was designed for the x-ray diagnosis of hot plasmas at x-ray energies in the range from 3 to 13 keV or wavelengths in the range from 1 to 4 Å, has the unique property that the Bragg condition is simultaneously fulfilled at each point on two crystal surfaces. However, in this imaging system layouts were only considered for a particular ray pattern, which limited the system to a certain Bragg angle pair and certain de-magnification.

SUMMARY OF THE INVENTION

Disclosed herein is an imaging apparatus, which includes an objective where the Bragg condition is simultaneously fulfilled at each point on the surfaces of two spherical reflectors, for use in EUV microscopy, EUV lithography, and x-ray imaging with an additional degree of freedom, which facilitates the optimization of the apparatus by allowing for variable de-magnifications and a choice of Bragg angles. Additionally, other layouts are disclosed herein with more general ray patterns. These more general ray patterns, which are obtained by rotating the above-mentioned particular ray pattern by an angle α about an axis through the common center of the two spherical reflectors, allow for variable de-magnifications.

In one aspect, an adjustable apparatus for forming an image of an object includes: a. at least one pair of concentric spherical reflectors wherein the reflectors share a common center and wherein each pair includes a convex reflector with a radius of curvature $R_1$ and a Bragg angle $\theta_1$, and a concave reflector with a radius of curvature $R_2$ and a Bragg angle $\theta_2$; wherein the spherical reflectors are concentric with a mathematical sphere that contains a radius RT, wherein: $RT=R_1 \cos(\theta_1)=R_2 \cos(\theta_2)$; b. a ray pattern established by reflection of radiation from the object on the reflectors; and c. an axis of symmetry of the ray pattern from the object, through the common center, to an image of the object and wherein the apparatus is configured to allow the ray pattern to be rotated about the axis.

In another aspect, an adjustable apparatus for forming an image of an object includes: a. at least one pair of concentric spherical reflectors wherein the reflectors share a common center and wherein each pair includes a convex reflector with a radius of curvature $R_1$ and a Bragg angle $\theta_1$, and a concave reflector with a radius of curvature $R_2$ and a Bragg angle $\theta_2$; wherein the spherical reflectors are concentric with a mathematical sphere that contains a radius RT, wherein: $RT=R_1 \cos(\theta_1)=R_2 \cos(\theta_2)$; b. a ray pattern established by reflection of radiation from the object on the reflectors; and c. an axis of symmetry of the ray pattern from the object, through the common center, to an image of the object and wherein the apparatus is configured to allow the ray pattern to be rotated about the axis preserving the same Bragg angles after the rotation.

In another aspect, the spherical reflectors are extended to form spherical annuli.

In another aspect, the spherical reflectors are multi-layer structures configured to reflect EUV rays.

In another aspect, the multi-layer structures have uniform d-spacings, $d_1$ and $d_2$, across the two reflector surfaces, where $d_1$ and $d_2$ are the periods of the two multilayer structures.

In another aspect, the spherical reflectors are spherically bent crystals.

In another aspect, the spherical reflectors are spherically bent mirrors.

In another aspect, the apparatus further comprises an aperture to select the rays that reach the image of the object.

In another aspect, the object is a mask.

In another aspect, the Bragg angles, $\theta_1$ and $\theta_2$, of the apparatus are each less than 45 degrees.

In another aspect, the Bragg angles, $\theta_1$ and $\theta_2$, of the apparatus are each larger than 45 degrees.

In another aspect the apparatus has a Bragg angle $\theta_1$ smaller than 45 degrees and a Bragg angle $\theta_2$ larger than 45 degrees.

In another aspect the apparatus is adjusted such that the Bragg angle pair and angle of rotation satisfies an aplanatic configuration for the spherical reflectors.

DETAILED DESCRIPTION

Disclosed herein is a novel adjustable apparatus that allows for the production of stigmatic images in x-ray imaging, EUV imaging, and EUVL. The shortcomings described previously can be overcome with the herein-described EUV adjustable configuration. The described apparatus incorporates additional properties compared to previously described objectives. The use of a pair of spherical reflectors containing a concave and convex arrangement has been applied to a EUV imaging system to allow for the image and optics to all be placed on the same side of a vacuum chamber. Additionally, the two spherical reflector segments previously described have been replaced by two full spheres or, more precisely, two spherical annuli, so that the total photon throughput is largely increased. Finally, the range of permissible Bragg angles and possible magnifications of the objective has been largely increased. The increase in permissible Bragg angles is based on application of derived formulas showing that in addition to the originally considered ray patterns, ray patterns that are rotated by an angle, α, are allowed. This angle is another degree of freedom, which facilitates the choice of Bragg angles and thereby an optimization of the objective's design with respect to the photon throughput, since reflectivity varies strongly with the angle of incidence. The apparatus can be assembled and aligned by using standard procedures for the assembly and alignment of optical components.

Figure 1:
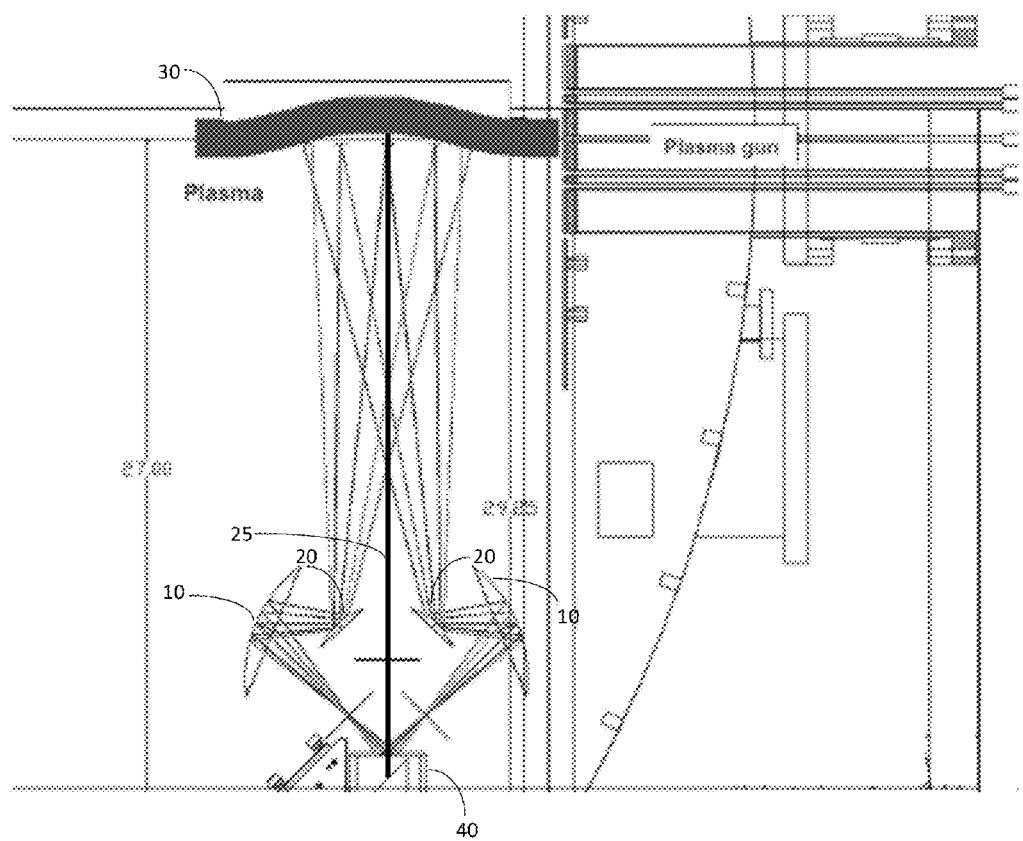
FIG. 1 depicts a 2D cut away of the design of an EUV imaging system for the Caltech Spheromak Gun configured with the EUV imaging apparatus, where a de-magnified image of the plasma is produced on a scintillator. For this application, the spherical reflectors of the imaging system may be either mirrors or multi-layer structures.

Referring now to FIG. 1, a 2D cutaway of an EUV imaging system or apparatus for the Caltech Spheromak Gun is shown. The EUV imaging apparatus is used as the main optical component. The optical components 10 and 20 are slices of the pair of spherical annuli in the system. One spherical reflector is convex 20 and one is concave 10. A plasma gun is used to generate plasma 30, which is the object to be imaged. An observable plasma area for this arrangement is 8 in.×8 in. or alternatively is 7 in.×7 in. The dimensions of the scintillator 40 is 1 in.×1 in. The distance between plasma and scintillator 40 is 24.58 in. The required de-magnification is M=8 or alternatively is M=7. The ray pattern travels from the plasma to the convex mirror 20, from the convex mirror 20 to the concave mirror 10, and from the concave mirror 10 to the "image" point at scintillator 40. The ray pattern has an axis of symmetry 25 for the ray pattern that connects the object to the image through the center of the spherical reflectors.

An important feature of the imaging apparatus is that the objective includes two concentric spherical reflectors. The objective includes a convex spherical reflector with the radius $R_1$ and a concave spherical reflector with the radius $R_2$. The two spheres share a common center, M. There is a third "mathematical" concentric sphere about M with the radius $RT=R_1 \cos(\Theta_1)=R_2 \cos(\Theta_2)$, where $\Theta_1$ and $\Theta_2$ are the glancing angles or Bragg angles on the two reflectors, and all of the rays, incident on or reflected from the two spherical reflectors, are tangential to this sphere. In the case of x-rays, when the spherical reflectors are spherical crystals with different crystal lattice spacing, $d_1$ and $d_2$, the condition, $R_1 \cos(\Theta_1)=R_2 \cos(\Theta_2)$, is absolutely necessary to fulfill the Bragg conditions, $\lambda=2d_1 \sin(\Theta_1)=2d_2 \sin(\Theta_2)$, simultaneously at each point on the surfaces of the two crystals. For the same reason, this condition is absolutely necessary if spherical multilayer structures are being used as reflectors. Additionally, an "object point" Q in the plasma and its "image point" I on the scintillator are always located on a straight line through the point M, the center of the mirror sphere (see FIG. 2). If L is the distance between plasma and scintillator and if $L_1$ and $L_2$ are the distances from Q to M and M to I, respectively, the following equations are obtained where M is the magnification:

$$L = L_1 + L_2 \tag{1}$$

and $$M = L_1/L_2 \tag{2}$$

The following are obtained from these equations:

$$L_1 = \frac{M}{M+1} \cdot L \tag{3}$$

and $$L_2 = \frac{1}{M+1} \cdot L \tag{4}$$

$$L_1 = \frac{R_1 \cos(\theta_1)}{\cos(2\theta_1 + \alpha)} \tag{5}$$

and $$L_2 = \frac{R_2 \cos(\theta_2)}{-\cos(2\theta_2 + \alpha)} \tag{6}$$

Figure 2:
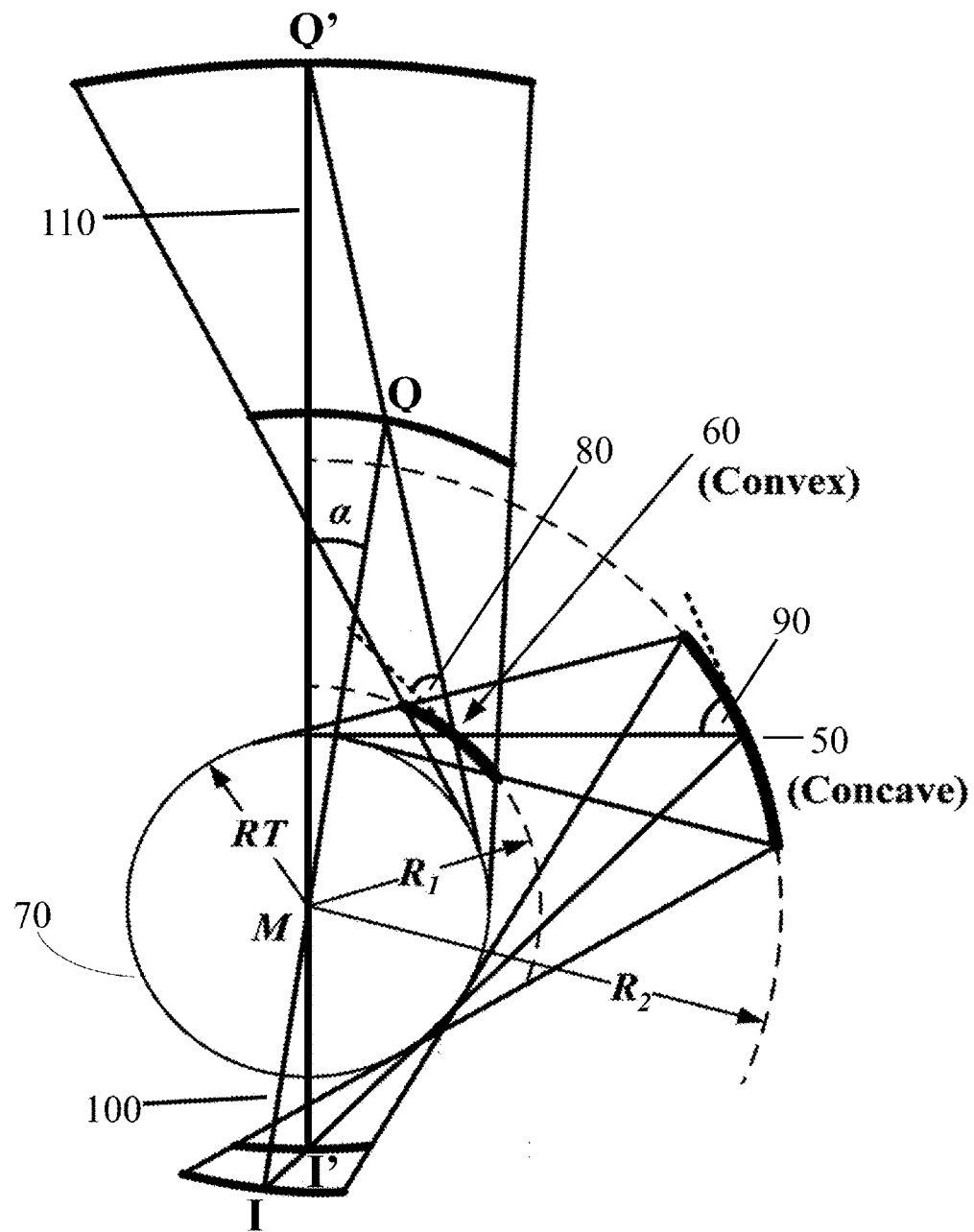
FIG. 2 depicts an example of an arrangement wherein two ray patterns are shown for a Bragg angle pair wherein the second ray pattern is the result of a rotation of the first ray pattern around its axis of symmetry by an angle α, resulting in a change in magnification.

Here, $\alpha$ is the angle of an assumed rotation of the ray pattern about an axis through M that is perpendicular to the drawing plane of FIG. 2; $\alpha$ is positive for a clockwise rotation. Previously, layouts were only considered for which $\alpha=0$ (Bitter, Hill, et al., 2012). By allowing for a rotation of the ray pattern, $\alpha \neq 0$, an additional degree of freedom is introduced such that instead of obtaining only one possible Bragg angle pair, $\Theta_1$ and $\Theta_2$, a large number of Bragg angle pairs, are obtained for which all of the requirements for stigmatic imaging are satisfied. This additional degree of freedom greatly facilitates optimization of a design with respect to the photon throughput and given experimental constraints. This additional degree of freedom is applied to the imaging apparatus.

In a preferred embodiment the objective configuration is based on a set of parameter values, which satisfies the so-called 'aplanatic solution' described previously (Artyukov, 2012) and described in a PPPL seminar by Jian Lu and M. Bitter (Appendix A). The essence of the aplanatic solution is that the position of an image point is invariant with respect to small changes, $\Delta\theta_1$ and $\Delta\theta_2$, of the Bragg angles, $\theta_1$ and $\theta_2$. Imaging errors resulting from spherical aberrations are then minimized and, moreover, the photon throughput is enhanced if small changes, $\Delta\theta_1$ and $\Delta\theta_2$, of the Bragg angles, $\theta_1$ and $\theta_2$ can be tolerated. It is pointed out that the values of $\Delta\theta_1$ and $\Delta\theta_2$ are, to some extent, also determined by the finite width of the rocking curve of the two crystals. Although the "PPPL seminar by Jian Lu and M. Bitter" (Appendix A) gives a derivation of the 'aplanatic solution' for an EUV objective for a ray pattern with a rotation angle $\alpha=0$, the generalization of this derivation to ray patterns with $\alpha \neq 0$ is straightforward for one of ordinary skill in the art.

Referring specifically to FIG. 2, a configuration of an adjustable apparatus is shown for two ray patterns with the Bragg angles $\Theta_1$ 80 and $\Theta_2$ 90. The first ray pattern is represented by the lines from the "object" point Q to the convex mirror 60, from the convex mirror 60 to the concave mirror 50, and from the concave mirror 50 to "image" point I. The "object" point Q and its "image" point I are located on the axis of symmetry 100 of the ray pattern, which passes through the common center M of the two mirror spheres. The axis of symmetry of the first ray pattern is also the y-axis. The second axis of symmetry is obtained, if the "object" point is moved on the extension of the black line through Q to the new "object" point Q' and then connect Q' and M by line 110. The extension of line 110 intersects the black line from the concave mirror to the "image" point I at the point I', which is the new "image" point associated with Q'. Axis of symmetry 110 includes an angle $\alpha$ with the y-axis 100 and will coincide with the y-axis, if the ray pattern is rotated clockwise about a perpendicular axis through M by the angle $\alpha$.

In one embodiment the configuration of FIG. 2 can be used for EUV imaging. In another embodiment, the configuration can be used for a stigmatic x-ray imaging scheme. In yet another embodiment, the imaging apparatus can be configured such that the ray pattern reflects from the concave reflector and then the convex reflector. In another embodiment, the rotation angle implements variable magnifications with given Bragg angles, wherein the object and image position move after rotation. By rotation of $\alpha$, the object moves from Q to Q' and the image moves from I to I'. For a given x-ray energy and matched pair of crystals or EUV rays and multilayer reflectors, one can therefore achieve arbitrary magnification for different applications by simply varying the rotation angle, $\alpha$.

Calculation of Bragg Angle Pairs

The imaging apparatus of FIG. 1 can be optimized by changing the Bragg angles by adjusting the rotation angle. The IDL program, bellan4.pro, calculates Bragg angle pairs that satisfy the conditions as disclosed herein, as well as the rotation angle, $\alpha$, for a given magnification, M, and $\rho = R_1/R_2$. The program was applied to the imaging apparatus of FIG. 1, as well as the arrangements described in FIGS. 2 and 3, as will be described in the following examples. The program calculates $\Theta_1$, $\Theta_2$, $\alpha$, and $R_2$, based on a given value for M (magnification), and $\rho$. The program uses the following formulas:

Formulas:

$$L = L_1 + L_2 = 24.58 \text{ in.} \tag{7}$$

$$M = \frac{L_1}{L_2} = 8 \text{ (or alternatively } M = 7) \tag{8}$$

From (7) and (8) follows:

$$L_1 = \frac{M}{M+1} * L; \; L_2 = \frac{1}{M+1} * L \tag{9}$$

$$R_1 \cos(\theta_1) = R_2 \cos(\theta_2) \tag{10}$$

$$L_1 = \frac{R_1 \cos(\theta_1)}{\cos(2\theta_1 + \alpha)} \tag{11}$$

$$L_2 = \frac{R_2 \cos(\theta_2)}{-\cos(2\theta_2 + \alpha)} \tag{12}$$

$$M = \frac{-\cos(2\theta_2 + \alpha)}{\cos(2\theta_1 + \alpha)} \tag{13}$$

Rewriting (13) gives:

$$M\cos(2\theta_1 + \alpha) = -\cos(2\theta_2 + \alpha) \quad (14)$$

$$M[\cos(2\theta_1)\cos(\alpha) - \sin(2\theta_1)\sin(\alpha)] =$$
$$\quad -[\cos(2\theta_2)\cos(\alpha) - \sin(2\theta_2)\sin(\alpha)]$$

$$M[\cos(2\theta_1) - \sin(2\theta_1)\tan(\alpha)] = -[\cos(2\theta_2) - \sin(2\theta_2)\tan(\alpha)]$$

$$M[2\cos^2(\theta_1) - 1 - 2\sin(\theta_1)\cos(\theta_1)\tan(\alpha)] =$$
$$\quad -[2\cos^2(\theta_2) - 1 - 2\sin(\theta_2)\cos(\theta_2)\tan(\alpha)]$$

$$M\left[2\cos^2(\theta_1) - 1 - 2\cos(\theta_1)\sqrt{1-\cos^2(\theta_1)}\,\tan(\alpha)\right] =$$
$$\quad -\left[2\rho^2\cos^2(\theta_1) - 1 - 2\rho\cos(\theta_1)\sqrt{1-\rho^2\cos^2(\theta_1)}\,\tan(\alpha)\right]$$

where $\rho = \dfrac{R_1}{R_2}$ $$2\cos^2(\theta_1)[M+\rho^2] - 2\cos(\theta_1)\tan(\alpha)\left[\dfrac{M\sqrt{1-\cos^2(\theta_1)} + \tan(\alpha)}{\rho\sqrt{1-\rho^2\cos^2(\theta_1)}}\right] = M+1$$

$$\cos^2(\theta_1) - \cos(\theta_1)\left[\dfrac{M\sqrt{1-\cos^2(\theta_1)} +}{\rho\sqrt{1-\rho^2\cos^2(\theta_1)}}\right]\dfrac{\tan(\alpha)}{M+\rho^2} = \dfrac{1}{2}\dfrac{M+1}{M+\rho^2}$$

$$\tan(\alpha) = \dfrac{[M+\rho^2]\cdot\cos^2(\theta_1) - \dfrac{1}{2}[M+1]}{\cos(\theta_1)\left[\dfrac{M\sqrt{1-\cos^2(\theta_1)} +}{\rho\sqrt{1-\rho^2\cos^2(\theta_1)}}\right]} = F(\cos(\theta_1)) \quad (15)$$

Specifically, the IDL program evaluates the right hand side of formula (15) as a function of $\Theta_1$ for given valued of M and $\rho$. Generally, $\rho=R_1/R_2<1$; and $0<\alpha<\alpha$ max=90°. The value of $\alpha$ is obtained for each $\Theta_1$. Using formula (10), the value of $\Theta_2$ is obtained for the given value of $\rho$. Using formulas (9) and (11) the value of $R_1$ is obtained from the known value of $L_1$. The value of $R_2$ is then obtained from:

$$R_2 = R_1/\rho.$$

The following examples are provided to further illustrate various preferred embodiments and techniques. It should be understood, however, that these examples do not limit the scope of the invention described in the claims. Many variations and modifications are intended to be encompassed within the spirit and scope of the invention.

Example 1

Table 1, below, illustrates results calculated using the IDL program showing all possible Bragg angle pairs that an adjustable imaging apparatus can be configured to. The data was obtained for a magnification of 8, as is shown in FIG. 1, and a $\rho$ of 0.5. The table shows 45 possible $\Theta_1$ and $\Theta_2$ pairs that satisfy the conditions required for stigmatic imaging, as well as showing the angle of rotation required. To illustrate the application of these calculations, the apparatus in one embodiment can be adjusted to have a $\Theta_1$ of 5° and a $\Theta_2$ of 60.1258°. The angle of rotation would be 73.0118° for this pair.

TABLE 1

| M = 8.00000 | | | | | | |
| --- | --- | --- | --- | --- | --- | --- |
| ρ = 0.500000 | | | | | | |
| theta1 = | | | | | | |
| 1.00000 | 2.00000 | 3.00000 | 4.00000 | 5.00000 | 6.00000 | 7.00000 |
| 8.00000 | 9.00000 | 10.0000 | 11.0000 | 12.0000 | 13.0000 | 14.0000 |
| 15.0000 | 16.0000 | 17.0000 | 18.0000 | 19.0000 | 20.0000 | 21.0000 |
| 22.0000 | 23.0000 | 24.0000 | 25.0000 | 26.0000 | 27.0000 | 28.0000 |
| 29.0000 | 30.0000 | 31.0000 | 32.0000 | 33.0000 | 34.0000 | 35.0000 |
| 36.0000 | 37.0000 | 38.0000 | 39.0000 | 40.0000 | 41.0000 | 42.0000 |
| 43.0000 | 44.0000 | 45.0000 | | | | |
| theta2 = | | | | | | |
| 60.0050 | 60.0202 | 60.0453 | 60.0806 | 60.1258 | 60.1810 | 60.2463 |
| 60.3214 | 60.4064 | 60.5013 | 60.6059 | 60.7203 | 60.8443 | 60.9778 |
| 61.1209 | 61.2734 | 61.4352 | 61.6063 | 61.7864 | 61.9757 | 62.1739 |
| 62.3809 | 62.5966 | 62.8209 | 63.0538 | 63.2950 | 63.5445 | 63.8020 |
| 64.0676 | 64.3411 | 64.6223 | 64.9111 | 65.2074 | 65.5110 | 65.8218 |
| 66.1397 | 66.4645 | 66.7960 | 67.1343 | 67.4790 | 67.8301 | 68.1874 |
| 68.5508 | 68.9201 | 69.2952 | | | | |
| alpha = | | | | | | |
| 81.3132 | 79.2233 | 77.1432 | 75.0729 | 73.0118 | 70.9597 | 68.9163 |
| 66.8814 | 64.8545 | 62.8354 | 60.8238 | 58.8193 | 56.8217 | 54.8306 |
| 52.8458 | 50.8669 | 48.8937 | 46.9259 | 44.9632 | 43.0054 | 41.0523 |
| 39.1035 | 37.1589 | 35.2181 | 33.2811 | 31.3475 | 29.4173 | 27.4901 |
| 25.5658 | 23.6443 | 21.7253 | 19.8087 | 17.8944 | 15.9821 | 14.0718 |
| 12.1634 | 10.2567 | 8.35149 | 6.44780 | 4.54548 | 2.64442 | 0.744542 |
| −1.15426 | −3.05206 | −4.94894 | | | | |
| R2 = | | | | | | |
| 5.08905 | 5.15952 | 5.22416 | 5.28310 | 5.33681 | 5.38542 | 5.42921 |
| 5.46842 | 5.50327 | 5.53406 | 5.56096 | 5.58418 | 5.60401 | 5.62059 |
| 5.63414 | 5.64485 | 5.65289 | 5.65845 | 5.66171 | 5.66281 | 5.66191 |
| 5.65914 | 5.65467 | 5.64862 | 5.64112 | 5.63227 | 5.62221 | 5.61104 |
| 5.59884 | 5.58573 | 5.57181 | 5.55715 | 5.54183 | 5.52594 | 5.50955 |
| 5.49272 | 5.47552 | 5.45801 | 5.44026 | 5.42230 | 5.40419 | 5.38598 |
| 5.36772 | 5.34943 | 5.33119 | | | | |

Example 2

Table 2, below, illustrates results for all possible Bragg angle pairs for an imaging apparatus with a desired magnification of 8 and a ρ of 0.75.

TABLE 2

M = 8.00000
ρ = 0.750000 theta1 =

| 1.00000 | 2.00000 | 3.00000 | 4.00000 | 5.00000 | 6.00000 | 7.00000 |
|---|---|---|---|---|---|---|
| 8.00000 | 9.00000 | 10.0000 | 11.0000 | 12.0000 | 13.0000 | 14.0000 |
| 15.0000 | 16.0000 | 17.0000 | 18.0000 | 19.0000 | 20.0000 | 21.0000 |
| 22.0000 | 23.0000 | 24.0000 | 25.0000 | 26.0000 | 27.0000 | 28.0000 |
| 29.0000 | 30.0000 | 31.0000 | 32.0000 | 33.0000 | 34.0000 | 35.0000 |
| 36.0000 | 37.0000 | 38.0000 | 39.0000 | 40.0000 | 41.0000 | 42.0000 |
| 43.0000 | 44.0000 | 45.0000 | | | | | theta2 =

| 41.4195 | 41.4492 | 41.4986 | 41.5676 | 41.6562 | 41.7643 | 41.8916 |
|---|---|---|---|---|---|---|
| 42.0380 | 42.2033 | 42.3872 | 42.5896 | 42.8100 | 43.0484 | 43.3043 |
| 43.5774 | 43.8673 | 44.1739 | 44.4966 | 44.8351 | 45.1891 | 45.5581 |
| 45.9419 | 46.3399 | 46.7519 | 47.1774 | 47.6161 | 48.0675 | 48.5313 |
| 49.0072 | 49.4947 | 49.9934 | 50.5031 | 51.0234 | 51.5539 | 52.0943 |
| 52.6442 | 53.2034 | 53.7714 | 54.3481 | 54.9330 | 55.5260 | 56.1267 |
| 56.7348 | 57.3501 | 57.9722 | | | | |

R2 =

| 3.49989 | 3.46669 | 3.43180 | 3.39537 | 3.35775 | 3.31908 | 3.27958 |
|---|---|---|---|---|---|---|
| 3.23940 | 3.19871 | 3.15771 | 3.11649 | 3.07518 | 3.03393 | 2.99282 |
| 2.95193 | 2.91137 | 2.87119 | 2.83147 | 2.79227 | 2.75364 | 2.71561 |
| 2.67822 | 2.64151 | 2.60551 | 2.57022 | 2.53567 | 2.50189 | 2.46886 |
| 2.43660 | 2.40512 | 2.37442 | 2.34449 | 2.31533 | 2.28694 | 2.25931 |
| 2.23243 | 2.20630 | 2.18092 | 2.15626 | 2.13232 | 2.10907 | 2.08654 |
| 2.06467 | 2.04348 | 2.02295 | | | | | alpha =

| 81.1009 | 79.1698 | 77.2440 | 75.3232 | 73.4067 | 71.4939 | 69.5845 |
|---|---|---|---|---|---|---|
| 67.6780 | 65.7741 | 63.8722 | 61.9721 | 60.0734 | 58.1759 | 56.2792 |
| 54.3830 | 52.4873 | 50.5917 | 48.6961 | 46.8003 | 44.9041 | 43.0074 |
| 41.1102 | 39.2122 | 37.3134 | 35.4137 | 33.5130 | 31.6114 | 29.7087 |
| 27.8049 | 25.8999 | 23.9938 | 22.0865 | 20.1781 | 18.2684 | 16.3576 |
| 14.4456 | 12.5324 | 10.6180 | 8.70239 | 6.78569 | 4.86785 | 2.94888 |
| 1.02883 | −0.892301 | −2.81449 | | | | |

Example 3

Comparison of Mirror Reflectivity

Mirror reflectivity decreases rapidly with increasing glancing angle or Bragg angle. To illustrate this point, the combined reflectivity of the two reflectors of the imaging apparatus in accordance with this disclosure was compared for three cases using the values in table 2 for M=8 and ρ=0.75, and using the data for gold-coated mirrors from the website:
http://henke.lbl.gov/optical_constants/mirror2.html Case 1:
Bragg angles: $\Theta_1=43°$ $\Theta_2=56.735°$
Rotation angle: $\alpha=1.03°$
Reflectivity for E=32 eV: 25.4% and 16%
Combined Reflectivity: 4.1%

Case 2:
Bragg angles: $\Theta_1=23°$ $\Theta_2=46.34°$
Rotation angle: $\alpha=39.21°$
Reflectivity for E=32 eV: 50% and 22.6%
Combined Reflectivity: 11.3%

Case 3:
Bragg angles: $\Theta_1=5°$ $\Theta_2=41.6562°$
Rotation angle: $\alpha=73.4067°$
Reflectivity for E=32 eV: 86.4% and 26.35%
Combined Reflectivity: 22.8%

Referring to Case 1, where $\alpha=1.03°$ and is approximately zero, is typical for previous configurations. Here, the Bragg angles are $\Theta_1=43°$ and $\Theta_2=46.34°$; and the combined mirror reflectivity is only 4.1%. The inability to change the angle of rotation results in a limited imaging apparatus.

Referring to Case 2, where $\alpha=39.21°$, is typical for the configuration as disclosed herein, configured for a substantial rotation of the ray pattern. Here, the Bragg angles are $\Theta_1=23°$ and $\Theta_2=41.34°$; and the combined mirror reflectivity is 11.3%.

Referring to Case 3, where $\alpha=73.4°$, is another example. Here, the Bragg angles are $\Theta_1=5°$ and $\Theta_2=41.66°$; and the combined mirror reflectivity is 22.8%.

Example 4

Figure 3:
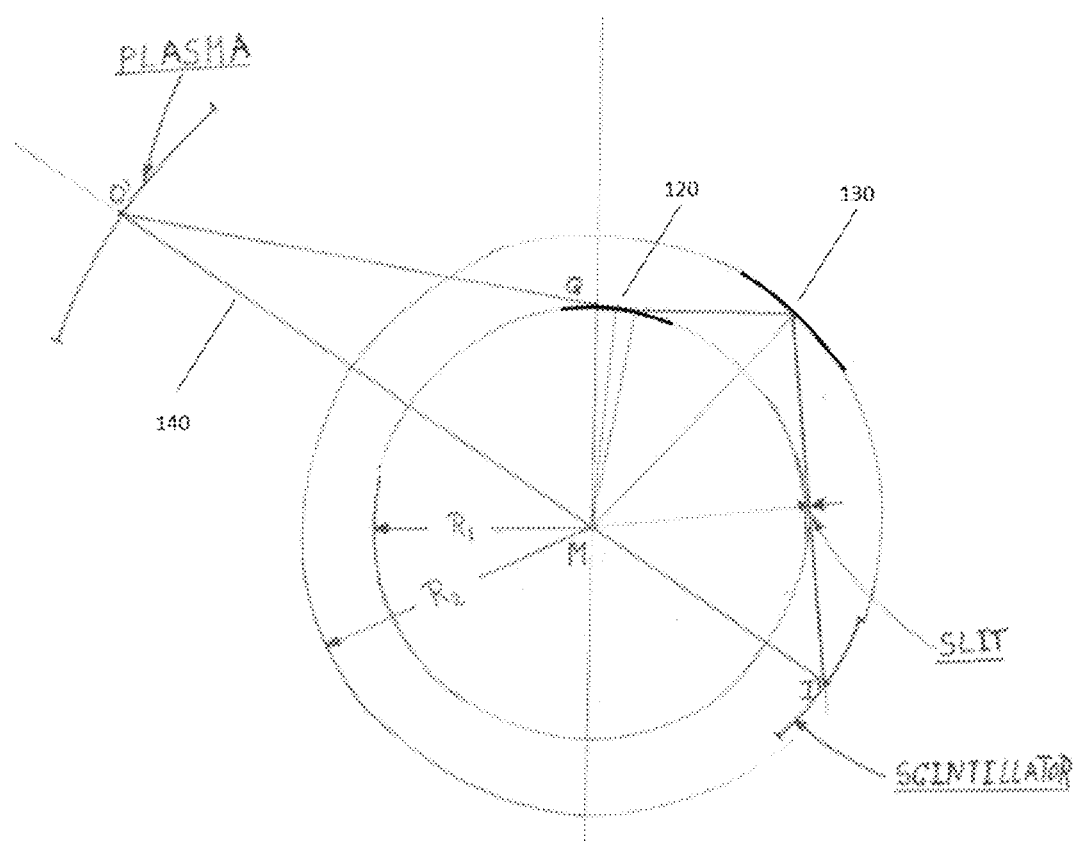
FIG. 3 depicts the ray pattern for a plasma-scintillator distance L=16 in., a magnification M=2, and Bragg angles $\Theta_1=5°$, $\Theta_2=41.6562°$, radii $R_1=4.13627$, $R_2=5.51303$, $\rho=R_1/R_2=0.75$, and $\alpha=57.2755°$.

Case 3 is considered further in Table 3 and FIG. 3. In this example the plasma-scintillator distance was changed to L=16 and the magnification was changed to M=2 in order to reduce the size of FIG. 3. FIG. 3 shows, as an example, the ray pattern for a plasma-scintillator distance L=16 in., a magnification M=2, and Bragg angles $\Theta_1=5°$, $\Theta_2=41.6562°$, $R_1=4.13627$, $R_2=5.51303$ $\rho=R_1/R_2=0.75$, $\alpha=57.2755°$. All of the possible Bragg angles and angles of rotation calculated by the IDL program are shown in Table 3. The circle with $RT=R_1 \cos(\Theta_1)$ is indistinguishable from the circle with the radius $R_1$ in FIG. 3, since $R_1 \cos(5°)=4.12053$. The convex 120 and concave 130 reflectors are shown. The axis of symmetry 140 of the ray pattern connects the "object" point Q' in the plasma with its "image" point I' on the scintillator and it passes through the center M. FIG. 3 also demonstrates that for a rotated ray pattern, $\alpha\#0$, Bragg angles $\Theta_2<45°$ are allowed, since $\Theta_2=41.6562°$. Previous objectives were required to have an angle for $\Theta_2$ greater than 45°. Furthermore, in Table 3, a test of the calculations shows that the distance MQ for all Bragg angle pairs is calculated to be 10.6667 and the distance MI for all Bragg angle pairs is calculated to be 5.33333. The two calculated distances add up to 16, which is the plasma-scintillator distance L, thereby validating the calculations. FIG. 3 also shows another embodiment whereas a slit or aperture is included in the apparatus to select for the rays that form the image I'. In another embodiment this aperture is required when reflecting light using spherical mirrors.

TABLE 3

L = 16.0000 (Plasma-Scintillator Distance)
M = 2.00000
$\rho$ = 0.750000

| theta1 = | | | | | | |
|---|---|---|---|---|---|---|
| 1.00000 | 2.00000 | 3.00000 | 4.00000 | 5.00000 | 6.00000 | 7.00000 |
| 8.00000 | 9.00000 | 10.0000 | 11.0000 | 12.0000 | 13.0000 | 14.0000 |
| 15.0000 | 16.0000 | 17.0000 | 18.0000 | 19.0000 | 20.0000 | 21.0000 |
| 22.0000 | 23.0000 | 24.0000 | 25.0000 | 26.0000 | 27.0000 | 28.0000 |
| 29.0000 | 30.0000 | 31.0000 | 32.0000 | 33.0000 | 34.0000 | 35.0000 |
| 36.0000 | 37.0000 | 38.0000 | 39.0000 | 40.0000 | 41.0000 | 42.0000 |
| 43.0000 | 44.0000 | 45.0000 | | | | |
| theta2 = | | | | | | |
| 41.4195 | 41.4492 | 41.4986 | 41.5676 | 41.6562 | 41.7643 | 41.8916 |
| 42.0380 | 42.2033 | 42.3872 | 42.5896 | 42.8100 | 43.0484 | 43.3043 |
| 43.5774 | 43.8673 | 44.1739 | 44.4966 | 44.8351 | 45.1891 | 45.5581 |
| 45.9419 | 46.3399 | 46.7519 | 47.1774 | 47.6161 | 48.0675 | 48.5313 |
| 49.0072 | 49.4947 | 49.9934 | 50.5031 | 51.0234 | 51.5539 | 52.0943 |
| 52.6442 | 53.2034 | 53.7714 | 54.3481 | 54.9330 | 55.5260 | 56.1267 |
| 56.7348 | 57.3501 | 57.9722 | | | | |
| R1 = | | | | | | |
| 4.43611 | 4.36007 | 4.28467 | 4.21002 | 4.13627 | 4.06352 | 3.99185 |
| 3.92134 | 3.85206 | 3.78409 | 3.71744 | 3.65217 | 3.58832 | 3.52589 |
| 3.46491 | 3.40538 | 3.34732 | 3.29073 | 3.23559 | 3.18191 | 3.12967 |
| 3.07885 | 3.02945 | 2.98143 | 2.93480 | 2.88951 | 2.84554 | 2.80288 |
| 2.76149 | 2.72135 | 2.68244 | 2.64472 | 2.60816 | 2.57275 | 2.53845 |
| 2.50524 | 2.47308 | 2.44196 | 2.41185 | 2.38272 | 2.35453 | 2.32728 |
| 2.30094 | 2.27548 | 2.25088 | | | | |
| R2 = | | | | | | |
| 5.91481 | 5.81343 | 5.71290 | 5.61336 | 5.51503 | 5.41802 | 5.32246 |
| 5.22845 | 5.13608 | 5.04545 | 4.95659 | 4.86956 | 4.78442 | 4.70118 |
| 4.61987 | 4.54051 | 4.46310 | 4.38764 | 4.31412 | 4.24254 | 4.17289 |
| 4.10513 | 4.03926 | 3.97525 | 3.91306 | 3.85267 | 3.79405 | 3.73717 |
| 3.68199 | 3.62847 | 3.57658 | 3.52629 | 3.47755 | 3.43033 | 3.38460 |
| 3.34032 | 3.29744 | 3.25595 | 3.21580 | 3.17695 | 3.13938 | 3.10304 |
| 3.06792 | 3.03397 | 3.00117 | | | | |
| alpha = | | | | | | |
| 63.4289 | 61.8889 | 60.3507 | 58.8133 | 57.2755 | 55.7364 | 54.1952 |
| 52.6510 | 51.1033 | 49.5513 | 47.9947 | 46.4330 | 44.8658 | 43.2927 |
| 41.7136 | 40.1283 | 38.5364 | 36.9380 | 35.3329 | 33.7211 | 32.1024 |
| 30.4771 | 28.8449 | 27.2060 | 25.5604 | 23.9083 | 22.2496 | 20.5844 |
| 18.9130 | 17.2354 | 15.5517 | 13.8620 | 12.1665 | 10.4654 | 8.75869 |
| 7.04660 | 5.32925 | 3.60680 | 1.87937 | 0.147137 | −1.58977 | −3.33121 |
| −5.07705 | −6.82714 | −8.58135 | | | | |
| Test of Calculations: | | | | | | |
| MQ = R₁*cos($\theta_1$)/cos(2*$\theta_1$ + alph): | | | | | | |
| 10.6667 | 10.6667 | 10.6667 | 10.6667 | 10.6667 | 10.6667 | 10.6667 |
| 10.6667 | 10.6667 | 10.6667 | 10.6667 | 10.6667 | 10.6667 | 10.6667 |
| 10.6667 | 10.6667 | 10.6667 | 10.6667 | 10.6667 | 10.6667 | 10.6667 |
| 10.6667 | 10.6667 | 10.6667 | 10.6667 | 10.6667 | 10.6667 | 10.6667 |
| 10.6667 | 10.6667 | 10.6667 | 10.6667 | 10.6667 | 10.6667 | 10.6667 |
| 10.6667 | 10.6667 | 10.6667 | 10.6667 | 10.6667 | 10.6667 | 10.6667 |
| 10.6667 | 10.6667 | 10.6667 | | | | |
| MI = −R₂*cos($\theta_2$)/cos(2*$\theta_2$ + alph) | | | | | | |
| 5.33333 | 5.33333 | 5.33334 | 5.33332 | 5.33333 | 5.33333 | 5.33334 |
| 5.33334 | 5.33333 | 5.33333 | 5.33334 | 5.33333 | 5.33334 | 5.33334 |
| 5.33333 | 5.33333 | 5.33333 | 5.33333 | 5.33334 | 5.33334 | 5.33334 |
| 5.33333 | 5.33333 | 5.33333 | 5.33334 | 5.33333 | 5.33333 | 5.33334 |
| 5.33334 | 5.33333 | 5.33334 | 5.33333 | 5.33334 | 5.33333 | 5.33333 |
| 5.33333 | 5.33333 | 5.33333 | 5.33333 | 5.33334 | 5.33333 | 5.33333 |
| 5.33333 | 5.33333 | 5.33333 | | | | |

The disclosed imaging apparatus configuration can be used in EUV lithography instrumentation for manufacturing the next-generation of computer processors and other semi-conductor integrated circuits. The present technology in lithography is conducted at 190 nm wavelength. The wavelength used in lithography determines the spatial size of structures in integrated circuits. The next generation of lithography is expected to be at 13.5 nm in the Extreme Ultra Violet (EUV) regime. This reduction in wavelength for lithography determines the density and size of components and represents a 100 times increase in component density. Presently, there is considerable investment in the development of EUV lithography where the disclosed configuration might be used. Furthermore, the disclosed EUV imaging apparatus can be applied to lithography being considered for even shorter wavelength, 6.5 nm, to enable printing of even finer scale features with the same advantages identified for lithography at 13.5 nm.

An important advantage of the disclosed imaging apparatus over the presently used Schwarzschild systems is that it has a much larger area of useful reflection for the optical transmission. More importantly, the disclosed imaging apparatus does not suffer from image errors and distortions that the Schwarzschild objectives are known to have if the rays deviate from normal incidence. Consequently, current plans for EUV lithography rely on using many optical components along with the Schwarzschild objectives to compensate for the known distortions, and they also rely upon scanning the EUV light through the lithography mask and semiconductor substrate simultaneously. The disclosed imaging apparatus can provide the same imaging for lithography without multiple exposures by moving both the mask and the semiconductor substrate synchronously. The disclosed imaging apparatus can also reduce the number of optical components and thus provide superior light transport to the semiconductor substrate, as compared to the imaging Schwarzschild objectives, because the maximum achievable multilayer reflectivity at normal incidence and 13.5 nm wavelength is only 0.7.

This new imaging apparatus could, in particular, make significant contributions to EUV lithography at wavelengths in the range from 10 to 15 nm, which is presently being developed for the manufacturing of the next-generation integrated circuits. One important advantage of this new EUV imaging apparatus is that the Bragg reflecting areas of the reflectors are maximized due to the fact that the Bragg condition is simultaneously fulfilled at every point on the two multi-layer reflector surfaces. It should, therefore, be possible to image or print the entire object (mask) onto a wafer in a single exposure.

Other important advantages of this new EUV imaging apparatus are that the angles of incidence or Bragg angles are arbitrary and that the astigmatism is fully eliminated for any choice of Bragg angles. By contrast, Schwarzschild objectives are restricted to the use of paraxial rays, since severe image distortions, such as spherical aberration, coma, and astigmatism, result from even small deviations from normal incidence. It is expected that some optical components presently used with Schwarzschild objectives to compensate for the image distortions can be eliminated, so that the EUV transmission will be significantly improved.

Another advantage is that the magnification or de-magnification obtained with this new EUV imaging apparatus is isotropic or uniform in all directions, so that the images of the mask, i.e., the printed circuits, are true to scale. Considering these superior features, one should expect that the herein disclosed EUV imaging apparatus will lead to substantial advancements and cost savings in the manufacturing process of the next-generation integrated circuits. The implementation of this new EUV imaging apparatus in this manufacturing process will not require a fundamental change of the existing technology, but will only require a replacement of the presently used objectives. Furthermore, this new EUV imaging apparatus can be applied to lithography being considered for even shorter wavelength, 6.5 nm, to enable printing of even finer scale features with the same advantages identified for lithography at 13.5 nm.

In describing alternative embodiments, the inclusion of various embodiments is illustrative and is not intended to limit the invention to those particular embodiments. Although the invention has been described in connection with specific preferred embodiments and certain working examples, it should be understood that the invention as claimed should not be unduly limited to such specific embodiments. Various modifications and variations of the described systems of the invention will be apparent to those skilled in the art without departing from the scope and spirit of the invention.

REFERENCES

All publications, appendices, and patents mentioned herein are hereby incorporated by reference in their entirety as if each individual publication or patent was specifically and individually incorporated by reference. In case of conflict, the present application, including any definitions herein, will control.

[1] DOE Record of Invention, Case No. M-830, of December 2011
[2] 'A new scheme for stigmatic x-ray imaging with large magnification', M. Bitter, K. W. Hill, L. F. Delgado-Aparicio, N. A. Pablant, S. Scott, F. Jones, P. Beiersdorfer, E. Wang, M. Sanchez del Rio, T. A. Caughey and J. Brunner, Rev. Sci. Instrum. 83, 10E527 (2012)
[3] 'Extreme ultraviolet lithography: A review', Banqiu Wu and Ajai Kumar, J. Vac. Sci. Technol. B 25, 1743 (2007)
[4] 'Conventional and modified Schwarzschild objective for EUV lithography: design relations', S. Bollanti, P. Dilazzaro, F. Flora, L. Mezi, D. Murra, A. Torre, Appl. Phys. B 85, 603 (2006)
[5] 'Analytical design method for a modified Schwarzschild optics', Antonio Budano, Francesco Flora, and Luca Mezi, Applied Optics 45, 4254 (2006)
[6] Design and development of an optical system for EUV-microscopy, Th. Foltyn, K. Bergmann, S. Braun, P. Gawlitza, A. Leson, W. Neff, and K. Walter, in Advances in Mirror Technology for X-Rays, EUV Lithography, Laser and other Applications, Proceedings of SPIE Vol. 5533, p. 37 (2004)
[7] Optical design Fundamentals for Infrared Systems, Max J. Riedl, SPIE Press 2001, Second Edition, ISBN 0-8194-4051-5
[8] A Novel Objective for EUV Microscopy and EUV Lithography: Working Principle and Design Studies for a Plasma Diagnostic Application. M. Bitter, K. W. Hill, and Ph. Efthimion, Internal Note.
[9] Schwarzschild objective and similar two-mirror systems, Igor A. Artyukov, Proc. of SPIE 2012, Vol. 8678.

What is claimed:

1. An adjustable apparatus for forming an image of an object, the apparatus comprising:
  a. at least one pair of concentric spherical reflectors wherein the reflectors share a common center and wherein each pair includes a convex reflector containing a radius of curvature $R_1$ and a Bragg angle $\theta_1$, and a concave reflector containing a radius of curvature $R_2$ and a Bragg angle $\theta_2$; wherein the spherical reflectors are concentric with a mathematical sphere that contains a radius RT, wherein:

$$RT = R_1 \cos(\theta_1) = R_2 \cos(\theta_2);$$

b. a ray pattern established by reflection of radiation from the object on the reflectors; and c. an axis of symmetry of the ray pattern from the object, through the common center, to an image of the object and wherein the apparatus is configured to allow the ray pattern to be rotated about the axis.

2. An adjustable apparatus for forming an image of an object comprising:

a. at least one pair of concentric spherical reflectors wherein the reflectors share a common center and wherein each pair includes a convex reflector containing a radius of curvature $R_1$ and a Bragg angle $\theta_1$, and a concave reflector containing a radius of curvature $R_2$ and a Bragg angle $\theta_2$; wherein the spherical reflectors are concentric with a mathematical sphere that contains a radius RT, wherein:

$$RT = R_1 \cos(\theta_1) = R_2 \cos(\theta_2);$$

b. a ray pattern established by reflection of radiation from the object on the reflectors; and c. an axis of symmetry of the ray pattern from the object, through the common center, to an image of the object and wherein the apparatus is configured to allow the ray pattern to be rotated about the axis preserving the same Bragg angles after the rotation.

3. The apparatus of claim 1 wherein the spherical reflectors are spherical annuli.

4. The apparatus of claim 1 wherein the spherical reflectors are multi-layer structures configured to reflect EUV rays.

5. The apparatus of claim 4 wherein the multi-layer structures have uniform 2d spacings, $2d_1$ and $2d_2$, across the two reflector surfaces, where $d_1$ and $d_2$ are the periods of the two multilayer structures.

6. The apparatus of claim 1 wherein the spherical reflectors are spherically bent crystals.

7. The apparatus of claim 1 wherein the spherical reflectors are spherically bent mirrors.

8. The apparatus of claim 7 further comprising an aperture to select the rays that reach the image of the object.

9. The apparatus of claim 1 wherein the object is a mask.

10. The apparatus of claim 2 wherein the spherical reflectors are spherical annuli.

11. The apparatus of claim 2 wherein the spherical reflectors are multi-layer structures configured to reflect EUV rays.

12. The apparatus of claim 11 wherein the multi-layer structures have uniform 2d spacings, $2d_1$ and $2d_2$, across the two reflector surfaces, where $d_1$ and $d_2$ are the periods of the two multilayer structures.

13. The apparatus of claim 2 wherein the spherical reflectors are spherically bent crystals.

14. The apparatus of claim 2 wherein the spherical reflectors are spherically bent mirrors.

15. The apparatus of claim 14 further comprising an aperture to select the rays that reach the image of the object.

16. The apparatus of claim 2 wherein the object is a mask.

17. The apparatus of claim 1 wherein the Bragg angles, $\theta_1$ and $\theta_2$, are each less than 45 degrees.

18. The apparatus of claim 1 wherein the Bragg angles, $\theta_1$ and $\theta_2$, are each greater than 45 degrees.

19. The apparatus of claim 1 wherein the Bragg angle $\theta_1$ is smaller than 45 degrees and the Bragg angle $\theta_2$ is larger than 45 degrees.

20. The apparatus of claim 1 wherein the Bragg angle pair and angle of rotation satisfies an aplanatic configuration for the spherical reflectors.

21. The apparatus of claim 2 wherein the Bragg angles, $\theta_1$ and $\theta_2$, are each less than 45 degrees.

22. The apparatus of claim 2 wherein the Bragg angles, $\theta_1$ and $\theta_2$, are each greater than 45 degrees.

23. The apparatus of claim 2 wherein the Bragg angle $\theta_1$ is smaller than 45 degrees and the Bragg angle $\theta_2$ is larger than 45 degrees.

24. The apparatus of claim 2 wherein the Bragg angle pair and angle of rotation satisfies an aplanatic configuration for the spherical reflectors.

25. An apparatus for forming an image of an object, the apparatus comprising: at least one pair of concentric spherical reflectors configured to reflect EUV rays wherein the reflectors share a common center and wherein each pair includes a convex reflector containing a radius of curvature $R_1$ and a Bragg angle $\theta_1$, and a concave reflector containing a radius of curvature $R_2$ and a Bragg angle $\theta_2$; wherein the spherical reflectors are concentric with a mathematical sphere that contains a radius RT, wherein:

$$RT = R_1 \cos(\theta_1) = R_2 \cos(\theta_2).$$

26. The apparatus of claim 25 wherein the Bragg angle pair and angle of rotation satisfies an aplanatic configuration for the spherical reflectors.

\* \* \* \* \*